(12) United States Patent  (10) Patent No.: US 6,704,670 B2
McTigue  (45) Date of Patent: Mar. 9, 2004

(54) SYSTEMS AND METHODS FOR WIDEBAND ACTIVE PROBING OF DEVICES AND CIRCUITS IN OPERATION

(75) Inventor: Michael T. McTigue, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 84 days.

(21) Appl. No.: 10/123,609

(22) Filed: Apr. 16, 2002

(65) Prior Publication Data

US 2003/0195713 A1 Oct. 16, 2003

(51) Int. Cl.[7] ............... G01R 13/00; G01R 31/02; G01R 1/06
(52) U.S. Cl. ............... 702/66; 324/72.5; 324/149
(58) Field of Search ............... 702/66, 67, 64, 702/65; 324/72.5, 149; 338/215, 216, 220, 49

(56) References Cited

U.S. PATENT DOCUMENTS

| 3,773,109 A | * | 11/1973 | Eberline | ............ 340/855.1 |
| 4,139,817 A | * | 2/1979 | Boer et al. | ............ 324/72.5 |
| 4,527,560 A | * | 7/1985 | Masreliez | ............ 606/31 |
| 4,917,096 A | * | 4/1990 | Englehart et al. | ............ 600/446 |

* cited by examiner

*Primary Examiner*—John Barlow
*Assistant Examiner*—Meagan S Walling

(57) ABSTRACT

Systems and methods for wideband active probing of devices and circuits in operation are provided. One such embodiment includes a probe amplifier housing that at least partially contains a probe amplifier circuitry. The probe amplifier circuitry and the probe housing are configured to be separately arranged and positioned from connected probing and signal monitoring apparatuses. Methods are also provided.

24 Claims, 8 Drawing Sheets

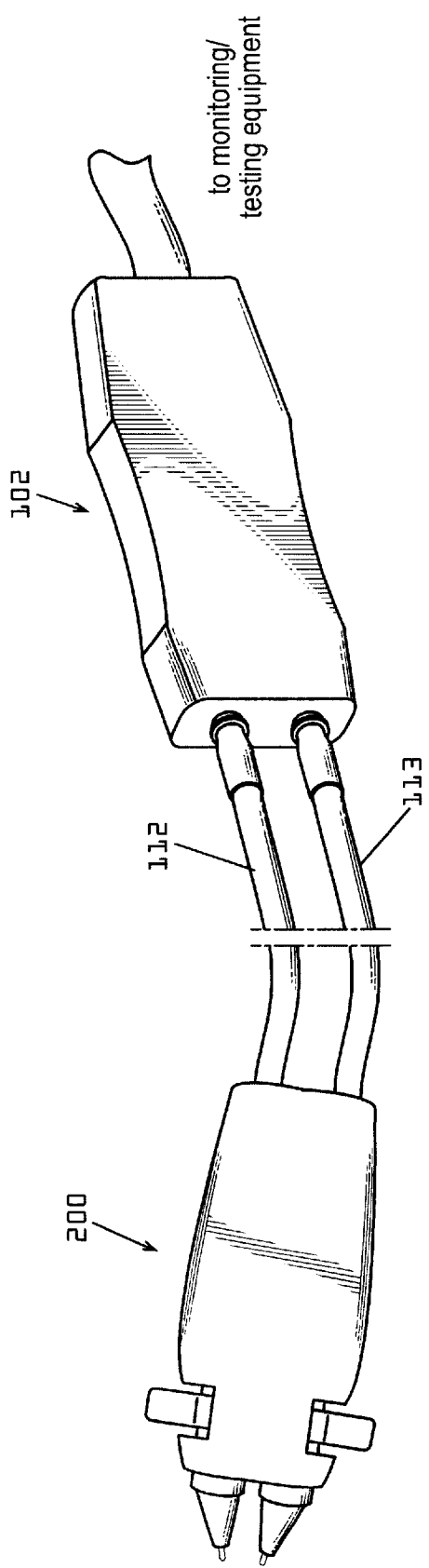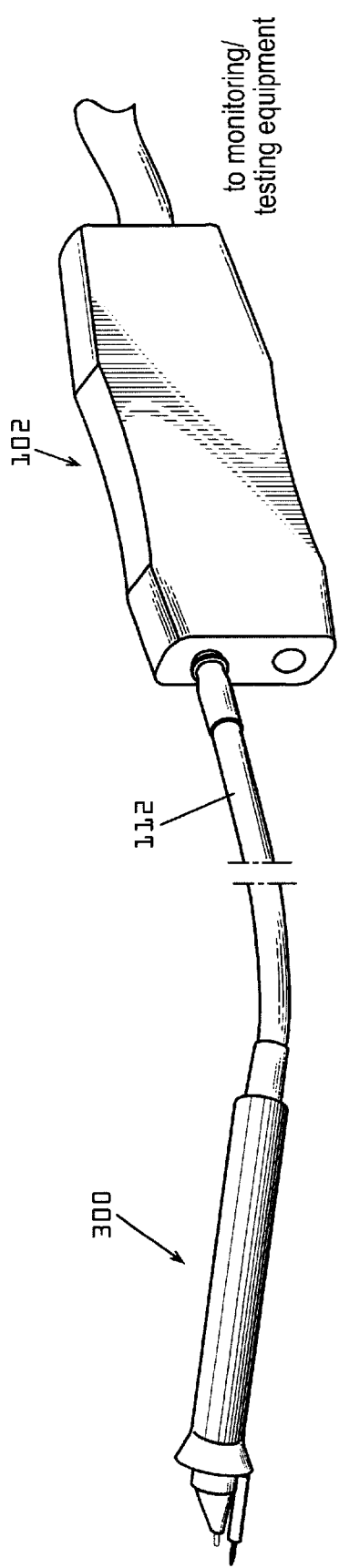

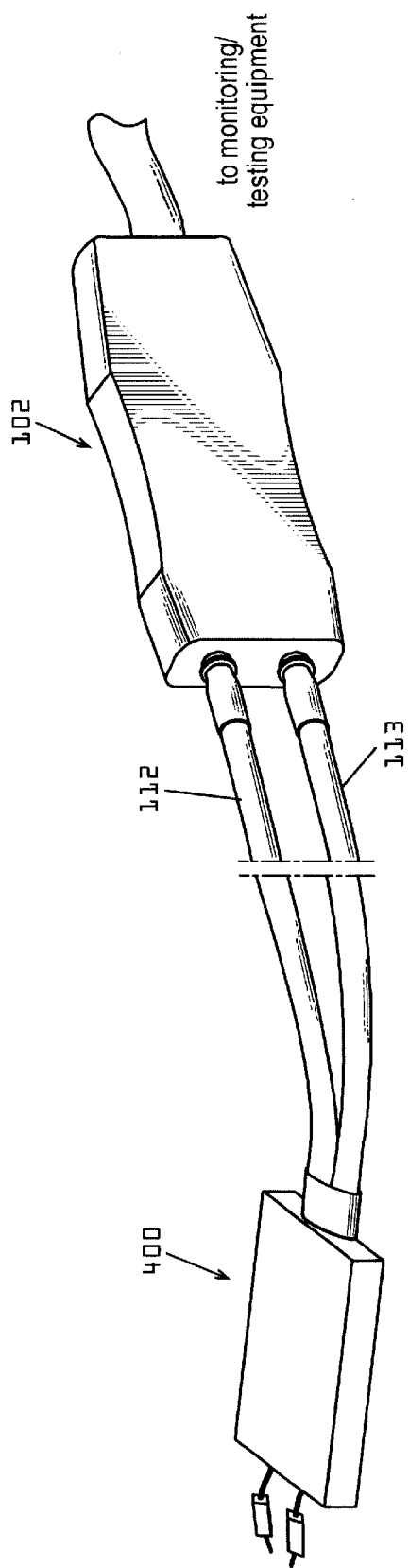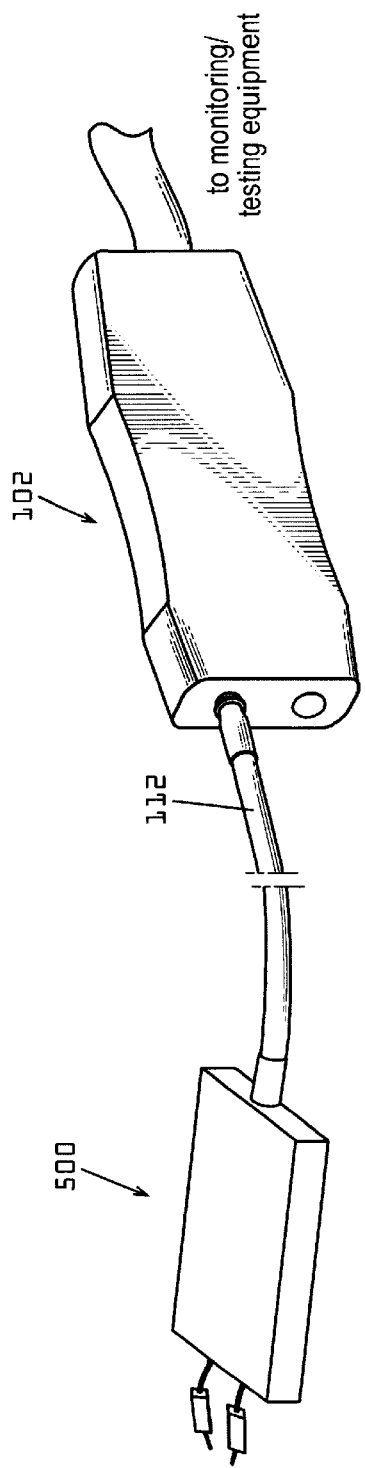

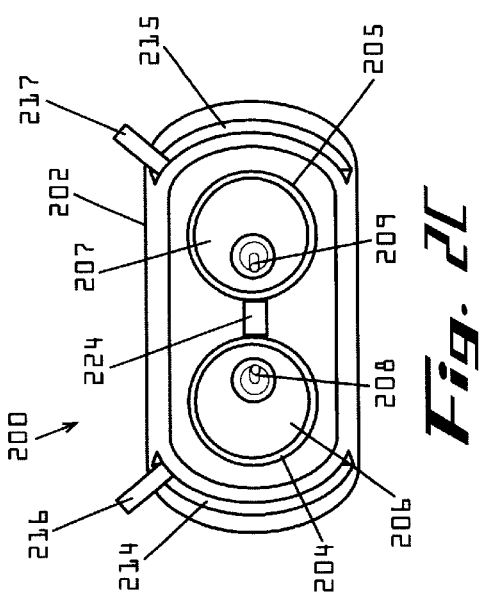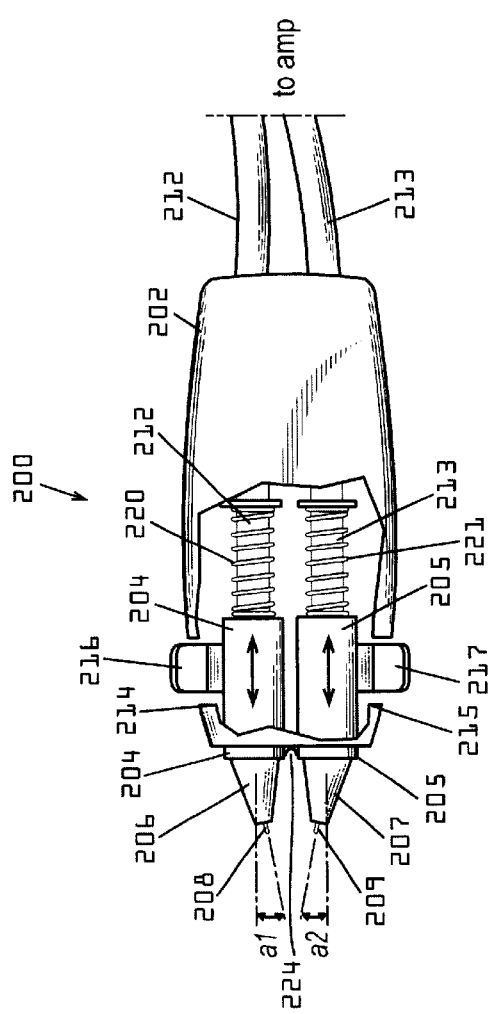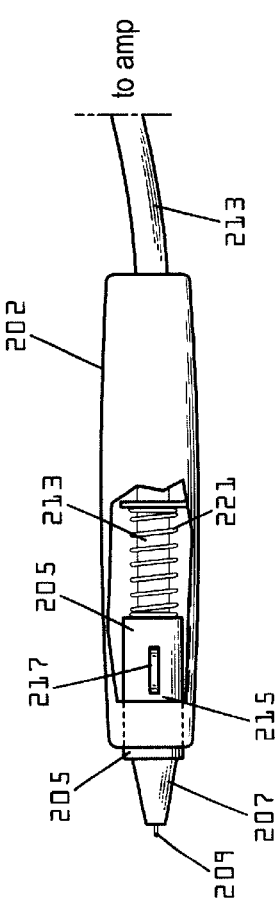

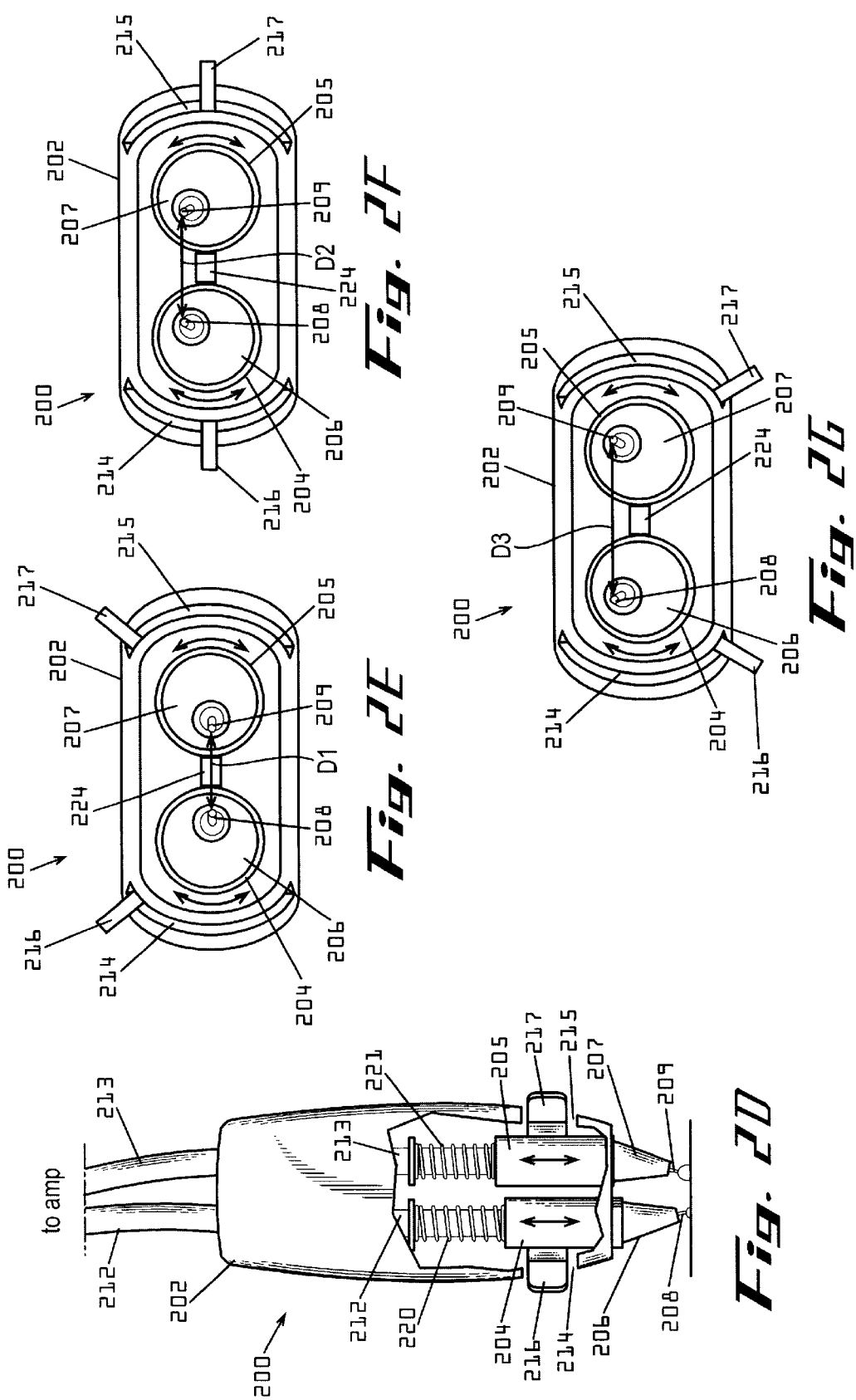

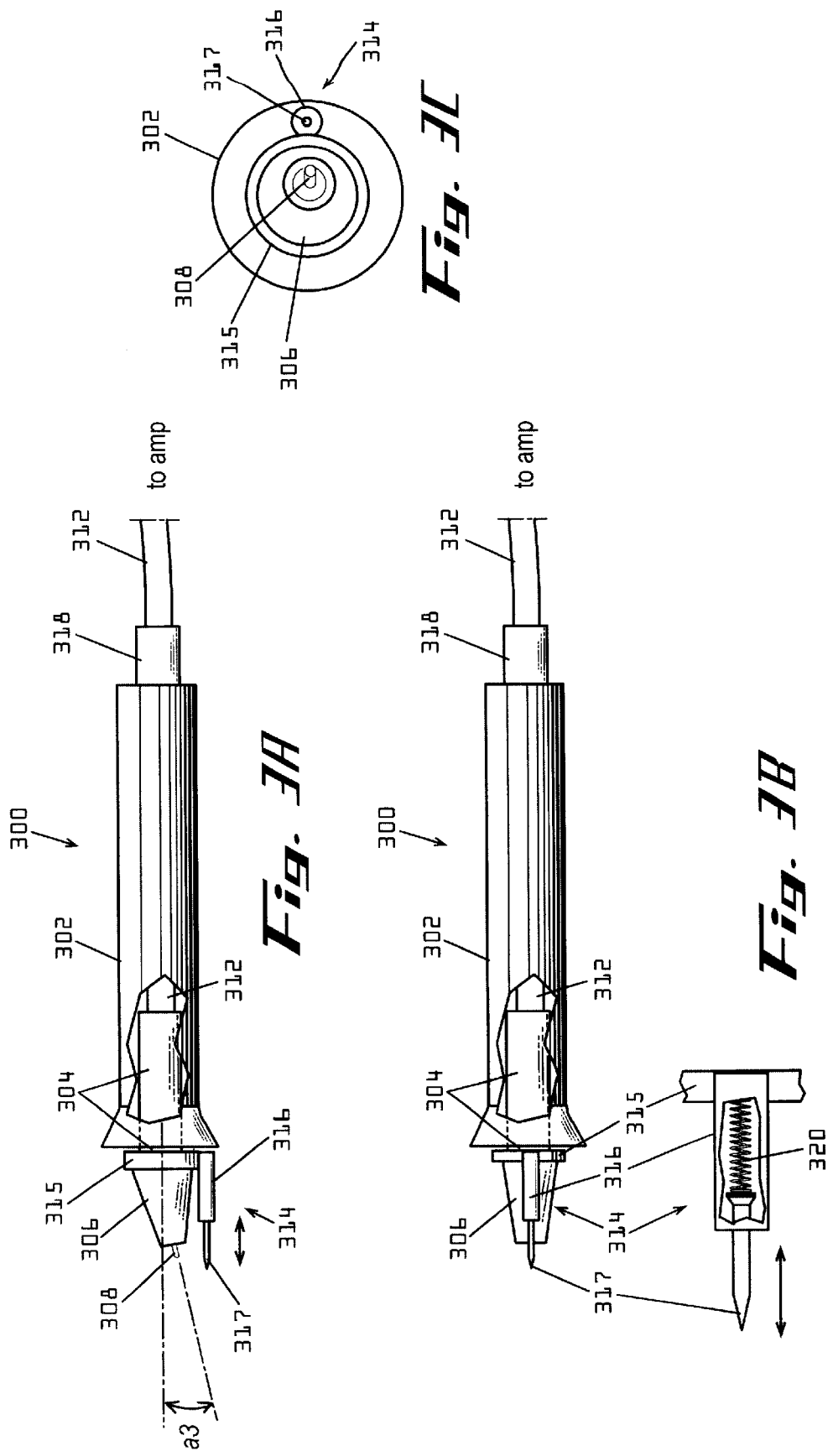

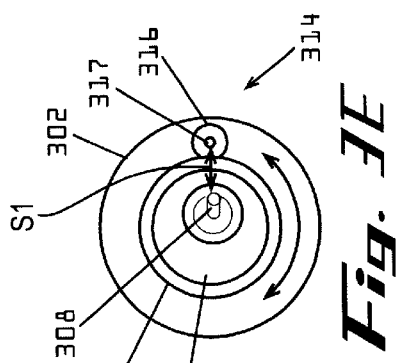
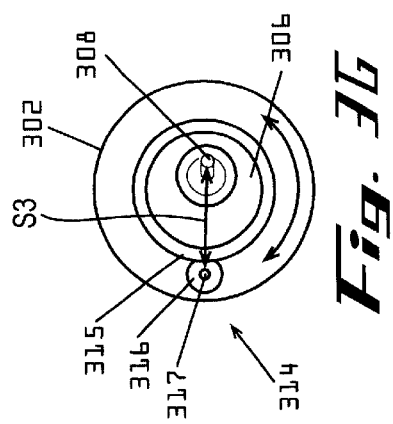
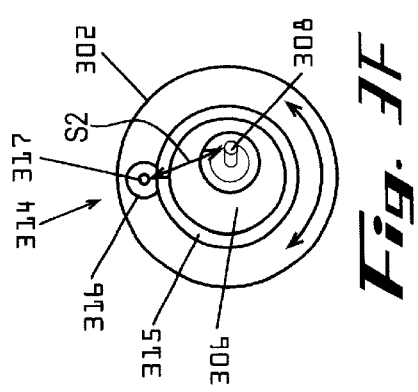
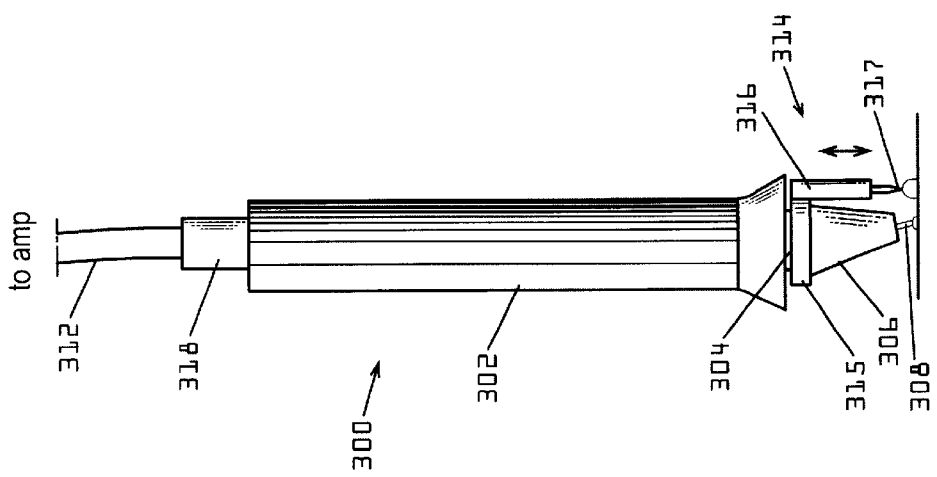

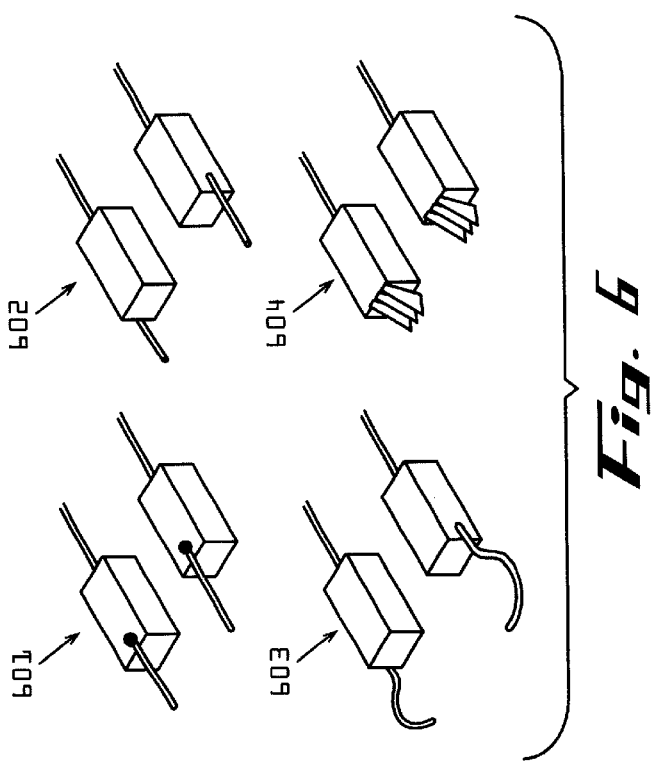
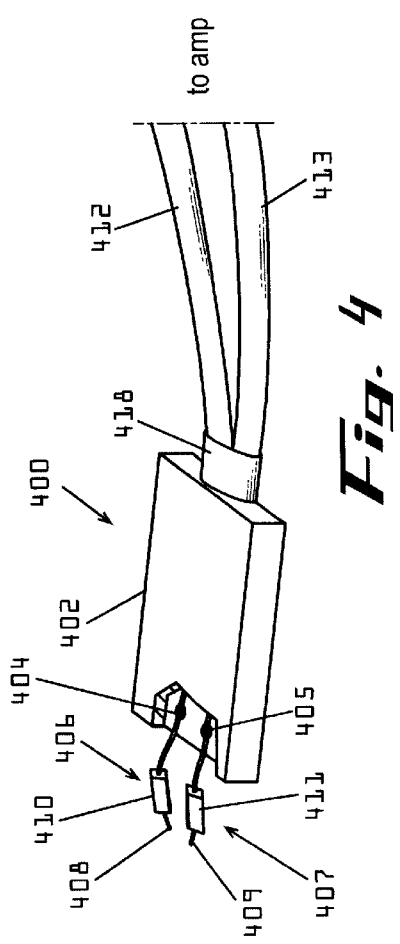
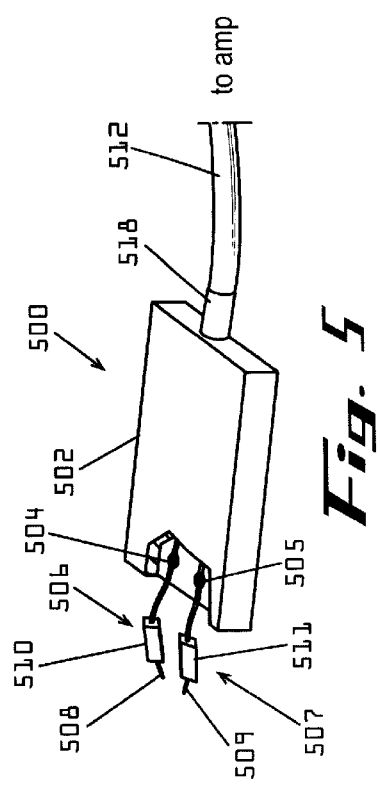

SYSTEMS AND METHODS FOR WIDEBAND ACTIVE PROBING OF DEVICES AND CIRCUITS IN OPERATION

TECHNICAL FIELD

The present invention is generally related to monitoring and testing of integrated circuit devices and, more particularly, is related to systems and methods for wideband active probing of devices and circuits in operation.

BACKGROUND OF THE INVENTION

Continuing advances in integrated circuit ("IC") technology are a major cause of the demand for improved systems and methods to monitor and/or test IC devices. For example, chips that are mounted on printed circuit boards ("PCBs") are being developed with higher component densities and smaller physical dimensions. In turn, the chip packages, i.e. the chip housing and electrical connectors, are being designed in more complex and compact configurations. A ball grid array ("BGA"), a chip package that uses an array of solder balls for the electrical connectors, is a typical example of such complex and compact chip package configurations. Other chip package configurations continue to use pins for electrical connectors, but the pins are smaller and arranged to tighter tolerances, and thus, such configurations are also becoming more complex and compact.

IC devices are also being developed that have increased performance characteristics. For example, as IC technology advances, central processing unit ("CPU") chips, for example that are utilized in computers, are being developed to have increased processing speeds. Furthermore, communication buses that interconnect internal IC devices within a computer system are being developed to support increased speed and bandwidth performance.

The increased complexity and compactness of chip package configurations and the increased performance characteristics of chips and other IC devices create challenges to effective and efficient monitoring and/or testing of such devices. For example, to monitor and/or test an IC device, electrical signals are typically obtained from the device and input to monitoring and/or testing equipment, such as an oscilloscope or logic analyzer. A probe is typically connected to such monitoring and/or testing equipment and used to obtain the electrical signals by making physical contact with the electrical connectors or other probe points of the IC device, a process typically referred to as "probing." Thus, in order to facilitate the effective and efficient monitoring and/or testing of IC devices, the probe must have physical and electrical features which overcome the challenges posed by the increased complexity and compactness of the chip package configurations and the increased performance characteristics of the IC devices.

Thus far, various systems and methods have been introduced in an attempt to provide physical and electrical features which overcome the challenges to effective and efficient monitoring and/or testing of IC devices, but shortcomings still persist. For example, active probing systems have been introduced that provide high bandwidth (i.e., high frequency) signal reception and low loading of probe tips (i.e., low current through-flow) by positioning the active electronics circuitry as close as possible to the probe tips. But, this practice results in several disadvantages. First, such active probing systems are typically large and bulky, which makes it difficult or impossible to securely connect the probe tips to the probe points of a PCB mounted IC device (e.g, by soldering) to perform hands-free probing and, further, to place the IC device in operation (e.g., by placing the PCB in an enclosure or card-cage) with the probe tips connected to the probe points to perform "in-situ" (i.e., in actual operation) probing. Second, the cable that connects such active probing systems to monitoring and/or testing equipment is usually bulky and inflexible since it contains power conductors (for power supply to the active electronics circuitry) as well as one or more coaxial cables (for signal transmission), and these undesirable features of the connection cable also makes it difficult to maintain the active probing system in position for probing an IC device. Third, such active probing systems are limited in their probing applications because the probe tips have a fixed relative physical positioning and the electrical characteristics of the probe tips (e.g., the damping resistance) are fixed relative to the probing system and cannot be varied. Finally, the cost of such active probing systems is typically too high to justify soldering probing attachments to them without concern for permanently damaging the probing systems.

As another example, differential probes (i.e., probes used for measuring the difference between two signals) have been introduced to provide high frequency differential probing of IC devices. Such differential probes have a fixed spacing between the probe tips which limits the configuration of IC device probe points which can be physically contacted for probing. In an attempt to overcome this shortcoming, "bent-wire" probe tip attachments have been introduced which can replace or modify the fixed-spacing probe tips. These bent-wire probe tip attachments can be attached to existing differential probes and bent to vary the spacing between the attached probe tips in order to contact the intended probe points of an IC device. But, the bent-wire probe tip attachments add undesirable parasitic impedance to the probe tip circuit which reduces the bandwidth (i.e., the high frequency signal reception capability) of the differential probe and, thereby, reduces the capability of the differential probe to accurately obtain signals from high frequency IC devices. Additionally, the positioning of the probe tips of the bent-wire probe tip attachments may undesirably vary during probing of an IC device and thereby result in loss of intended contact with the probe points as well unintended contact with other probe points and/or damaging short-circuit conditions.

As yet another example, wideband (i.e., high bandwidth) probes have been introduced to measure voltage signals of IC devices. Such wideband probes typically must contact a probe signal point and a ground probe point of an IC device with a probe tip and a ground contact, respectively, to obtain voltage signals. A fixed position "spring wire" (e.g., an offset bent wire) or "pogo pin" (i.e., a telescopically retracting pin) is typically utilized as a ground contact for these wideband probes. Since the distance between a signal probe point and a ground probe point varies among IC devices, the ground contacts of existing wideband probes are typically bent to allow the probe tips to contact the probe points. There are several disadvantages to utilizing a spring wire as the ground contact in existing wideband probes. First, the length of a practical spring wire is relatively long and, thus, adds undesirable parasitic impedance to the probe circuit, thereby reducing the bandwidth capability of the probe. Second, the positioning of the spring wire ground contact may undesirably vary (or "skate") during probing of an IC device and thereby result in loss of intended contact with the ground probe point as well as cause unintended contact with other probe points and/or damaging short-circuit conditions. Third, the spacing set between the probe tip and the ground contact by bending the spring wire may vary, even during routine handling of the probe, thus, making the positioning accuracy unreliable for repeated probing without repeated bending adjustments. Similarly, in utilizing a pogo pin as the ground contact in existing wideband probes, the typical practice of bending the pogo pin to facilitate contact with a ground probe point may result in skating, particularly since the bend in the rigid pogo pin typically must be maintained by force applied against the probe points during probing. Because of its rigidity, the pogo pin also does not accurately maintain the adjusted position during repeated probing.

Based on the foregoing, it should be appreciated that there is a need for improved systems and methods which address the aforementioned, as well as other, shortcomings of existing systems and methods.

SUMMARY OF THE INVENTION

The present invention provides systems and methods for wideband active probing of devices and circuits in operation.

Briefly described, one embodiment of the system, among others, includes a probe amplifier housing. Probe amplifier circuitry is at least partially contained within the probe amplifier housing. Additionally, the probe amplifier circuitry and the probe housing are configured to be separately arranged and positioned from connected probing and signal monitoring apparatuses.

Another embodiment of the system includes a probe amplifier unit that includes probe amplifier circuitry. A first plurality of conductors are electrically connected to the probe amplifier circuitry and a signal monitoring apparatus is electrically connected to the probe amplifier circuitry through the first plurality of conductors. A second plurality of conductors are electrically connected to the probe amplifier circuitry and a probing apparatus is electrically connected to the probe amplifier circuitry through the second plurality of conductors.

Yet another embodiment of the system includes means for amplifying a probe signal. Means for power supply and signal transmission and means for signal transmission are each electrically connected to the means for amplifying a probe signal. Means for monitoring signals are electrically connected to the means for amplifying a probe signal via the means for power supply and signal transmission. Additionally, means for probing an electrical circuit are electrically connected to the means for amplifying a probe signal via the means for signal transmission.

The present invention can also be viewed as providing methods for wideband active probing of devices and circuits in operation. In this regard, one embodiment of such a method, among others, can be broadly summarized by the following steps: providing a probe amplifier unit that includes probe amplifier circuitry, electrically connecting a first plurality of conductors to the probe amplifier circuitry, electrically connecting a signal monitoring apparatus to the first plurality of conductors, electrically connecting a second plurality of conductors to the probe amplifier circuitry, electrically connecting a probing apparatus to the second plurality of conductors, probing an electrical circuit with the probing apparatus, and monitoring signals with the signal monitoring apparatus.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 2A is a plan view of an embodiment of the differential probe unit depicted in FIG. 1B.

FIG. 2B is a cross-sectional view of an embodiment of the differential probe unit depicted in FIG. 1B.

FIG. 2C is an end view of an embodiment of the differential probe unit depicted in FIG. 1B.

FIG. 2D is a side view of an embodiment of the differential probe unit of FIG. 1B depicted with the probe tips contacting solder points on a printed circuit board.

FIG. 2E is an end view of an embodiment of the differential probe unit of FIG. 1B with the probe tips positioned at a minimal spacing.

FIG. 2F is an end view of an embodiment of the differential probe unit of FIG. 1B with the probe tips positioned at a middle spacing.

FIG. 2G is an end view of an embodiment of the differential probe unit of FIG. 1B with the probe tips positioned at a maximal spacing.

FIG. 3A is a plan view of an embodiment of the single-end probe unit depicted in FIG. 1C.

FIG. 3B is a cross-sectional view of an embodiment of the single-end probe unit depicted in FIG. 1C.

FIG. 3C is an end view of an embodiment of the single-end probe unit depicted in FIG. 1C.

FIG. 3D is a side view of an embodiment of the single-end probe unit of FIG. 1C depicted with the probe tip and ground tip contacting solder points on a printed circuit board.

FIG. 3E is an end view of an embodiment of the single-end probe unit of FIG. 1C with the ground tip positioned at a minimal spacing to the probe tip.

FIG. 3F is an end view of an embodiment of the single-end probe unit of FIG. 1C with the ground tip positioned at a middle spacing to the probe tip.

FIG. 3G is an end view of an embodiment of the single-end probe unit of FIG. 1C with the ground tip positioned at a maximal spacing from the probe tip.

FIG. 4 is a perspective view of an embodiment of the differential probe tip unit depicted in FIG. 1D.

FIG. 5 is a perspective view of an embodiment of the single-end probe tip unit depicted in FIG. 1E.

FIG. 6 depicts exemplary probe tip units that may be implemented in various embodiments the differential and/or single-end probe tip units of FIGS. 1D and 1E.

DETAILED DESCRIPTION

Figure 1H:
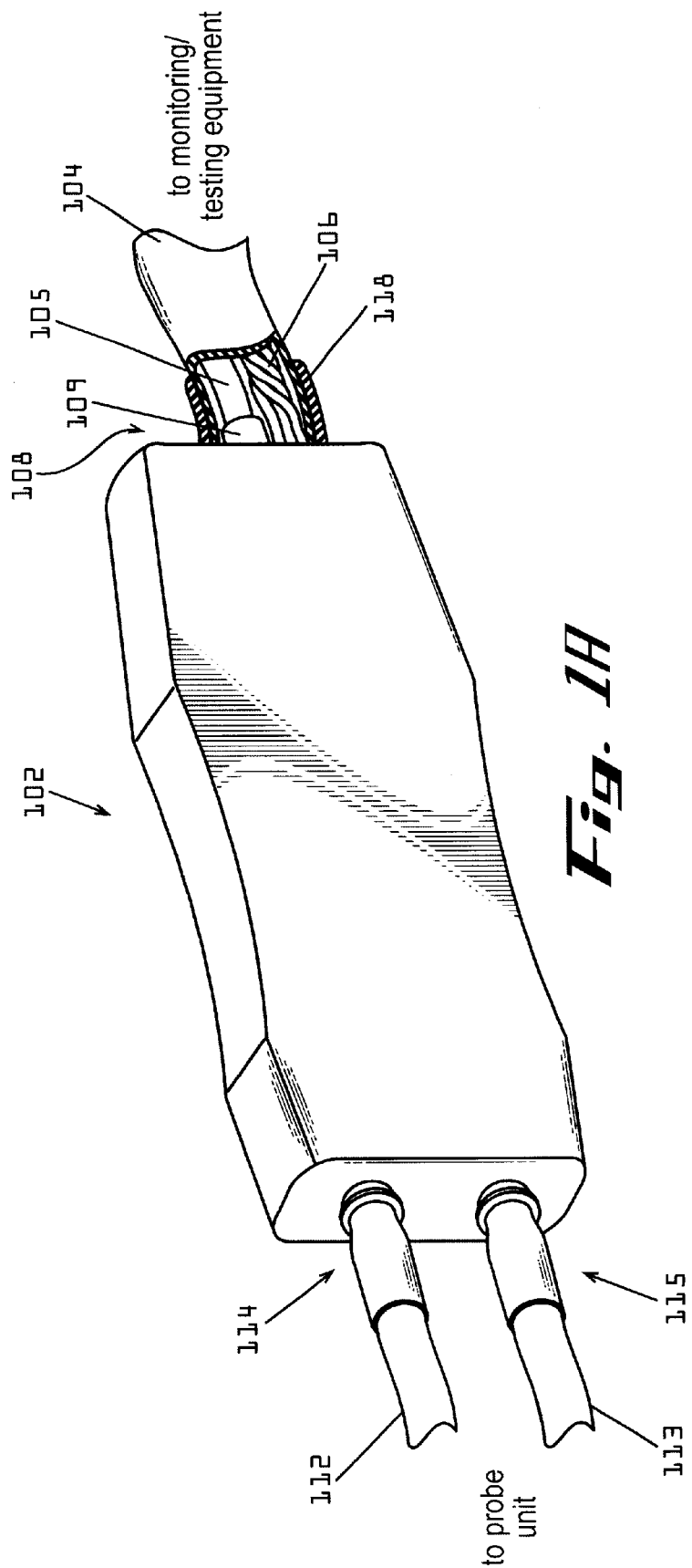
FIG. 1A is a perspective view of an embodiment of a probe amplifier unit.
FIG. 1B is a perspective view of an embodiment of a probe amplifier unit connected to a differential probe unit.
FIG. 1C is a perspective view of an embodiment of a probe amplifier unit connected to a single-end probe unit.
FIG. 1D is a perspective view of an embodiment of a probe amplifier unit connected to a differential probe tip unit.
FIG. 1E is a perspective view of an embodiment of a probe amplifier unit connected to a single-end probe tip unit.

Having summarized the invention above, reference is now made in detail to the figures which depict exemplary embodiments of the invention. Referring to FIG. 1A, a perspective view of an embodiment of a probe amplifier unit 102 is shown. The probe amplifier unit 102 includes an enclosure, housing, or other structure that encloses probe amplifier circuitry (not shown). Typically, such probe amplifier circuitry supports a wideband active probing system that provides high bandwidth signal reception and low loading of connected probe tips. For example, the probe amplifier circuitry housed within the probe amplifier unit 102 may provide a probing bandwidth of at least 3 GHz.

The probe amplifier unit 102 may be constructed of various materials. For example, the probe amplifier unit 102 may be constructed of various types of plastic material. Other materials may be used to construct the probe amplifier unit 102 within the scope of the invention. Such other materials preferably should not interfere with the operation or use of the probe amplifier unit 102.

A power supply/signal transmission cable 104 is typically connected to the probe amplifier unit 102. The power supply/signal transmission cable 104 typically includes cable insulation or sheathing that covers various conductors. For example, the power supply/signal transmission cable 104 may contain a coaxial conductor 105, such as a coaxial cable, for transmission of signals. Additionally, the power supply/signal transmission cable 104 may contain one or more power conductors 106, such as insulated copper conductors that are solid or stranded in configuration. Typically, the power conductors 106 contained within the power supply/signal transmission cable 104 are configured to provide DC electrical power to the probe amplifier unit 102. Thus, for example, the power conductors 106 may include a positive conductor, a negative conductor, and a ground conductor. However, the power conductors 106 may also include additional conductors for the purpose of providing electrical power to the probe amplifier unit 102. The power supply/signal transmission cable 104 may additionally include other conductors for various purposes such as, for example, to transmit control signals to/from the probe amplifier unit 102. It is noted that in some embodiments (not depicted), the foregoing various conductors may not be contained within a cable or within just a single cable. Further, the power supply/signal transmission cable 104 and/or the various conductors contained therein may include other types of cables or conductors that serve the aforementioned purposes.

The power supply/signal transmission cable 104 is usually connected to the probe amplifier unit 102 by a power supply/signal transmission cable connector 108. The power supply/signal transmission cable connector 108 may include one or more connectors and/or connections to the probe amplifier unit 102 as depicted. For example, the coaxial conductor 105 of the power supply/signal transmission cable 104 may be connected to the probe amplifier circuitry of the probe amplifier unit 102 by a coaxial connector 109. As another example, the power conductors 106 of the power supply/signal transmission cable 104 may be connected to the probe amplifier circuitry of the probe amplifier unit 102 by solder terminal connections (not shown). Various other types of connectors and/or connections may be implemented to connect the various conductors of the power supply/signal transmission cable 104 to the probe amplifier unit 102 within the scope of the invention.

The power supply/signal transmission cable connector 108 may also include a strain relief device 118. Such a strain relief device 118 functions to prevent excessive strain from being placed on the various conductors, connectors, and/or connections at the connection point of the power supply/signal transmission cable connector 108 to the probe amplifier unit 102. For example, if the probe amplifier unit 102 is handled, strain may be transferred from the probe amplifier unit 102 to the strain relief device 118 to the sheathing of the power supply/signal transmission cable 104. In some embodiments, the power supply/signal transmission cable connector 108 may also function as a strain relief device. Various types and configurations of strain relief devices may be implemented within the scope of the invention.

As indicated in FIG. 1A, the far end of the power supply/signal transmission cable 104 is typically connected to monitoring and/or testing equipment (not depicted). For example, the power supply/signal transmission cable 104 may be connected to an oscilloscope or logic analyzer. The far end of the power supply/signal transmission cable 104 may also be connected to other types of equipment to facilitate the function of the probe amplifier unit 102.

One or more probe cables, examples of which are indicated by reference numerals 112 and 113, may also be connected to the probe amplifier unit 102. Typically, these probe cables 112, 113 convey signals received by a probe unit (not shown) to the probe amplifier unit 102. The probe cables 112, 113 may include cable insulation or sheathing that contains one or more types of conductors. Typically, the probe cables 112, 113 are insulated coaxial conductors (e.g., coaxial cables) that are adapted to convey signals to facilitate wideband probing. The probe cables 112, 113 may be substantially flexible to facilitate handling of the probe amplifier unit 102 without causing substantial movement of a connected probe unit. The probe cables 112, 113 may include other types of conductors that serve to facilitate wideband probing or other functions.

As depicted in FIG. 1A, the probe cables 112, 113 are typically connected to the probe amplifier unit 102 by probe cable connectors 114, 115, respectively. The probe cable connectors 114, 115 may include one or more connectors and/or connections to the probe amplifier unit 102. For example, one or more of the probe cable connectors 114, 115 may be coaxial connectors. Typically, the probe cable connectors 114, 115 provide a connection of the probe cables 112, 113 to the probe amplifier circuitry contained within the probe amplifier unit 102. Various other types of connectors and/or connections may be implemented to connect the probe cables 112, 113 to the probe amplifier unit 102 within the scope of the invention.

The probe cable connectors 114, 115 may also include strain relief devices, for example, as depicted. Such strain relief devices prevent excessive strain from being placed on the various conductors, connectors, and/or connections at the connection points of the probe cables 112, 113 to the probe amplifier unit 102. In some embodiments, the probe cable connectors 114, 115 may also function as strain relief devices, as depicted for example in FIG. 1A. Various other types and configurations of strain relief devices may also be implemented within the scope of the invention.

The probe cables 112, 113 are typically connected to a probe unit (not depicted). In this regard, FIGS. 1B–1E depict the probe amplifier unit 102 connected to various probe units by one or more probe cables 112, 113.

FIG. 1B depicts the probe amplifier unit 102 connected to a differential probe unit 200 by the probe cables 112, 113. FIG. 1C depicts the probe amplifier unit 102 connected to a single-end probe unit 300 by the probe cable 112. FIG. 1D depicts the probe amplifier unit 102 connected to a differential probe tip unit 400 by the probe cables 112, 113. And, FIG. 1E depicts the probe amplifier unit 102 connected to a single-end probe tip unit 500 by the probe cable 112. The foregoing probe units will be discussed in further detail below.

As discussed above with respect to FIG. 1A, the probe amplifier unit 102 may facilitate wideband active probing by interfacing a probe unit to monitoring and/or testing equipment. In that regard, the implementation of the probe amplifier unit 102 provides physical and electrical features not provided by existing systems and methods. These features overcome challenges posed by the increased complexity and compactness of IC chip package configurations and the increased performance characteristics of IC devices. For example, the implementation of the probe amplifier unit 102 provides high bandwidth signal reception (e.g., 3 GHz or greater) and low loading of the probe tips of a connected probe unit while allowing the probe amplifier circuitry to be positioned remotely from the probe unit. The implementation of the probe amplifier unit 102 also provides other beneficial physical and electrical features that are not provided by existing systems and methods. These additional features are discussed hereafter.

The implementation of the probe amplifier unit 102 to facilitate wideband active probing of IC devices provides the capability to securely connect a probe tip unit (e.g., the probe tip units 400, 500 depicted in FIGS. 1D, 1E) to an IC device. This capability provides such benefits as hands-free probing and minimized parasitic input impedance at the connection to the probe points. This capability to securely connect a probe tip unit is available for several reasons. One, the probe tip unit does not need to include the probe amplifier circuitry since that circuitry is remotely contained in the probe amplifier unit 102. As a result, the probe tip unit is sufficiently small and lightweight to facilitate secure connections of the probe tip unit to the probe points of an IC device (e.g., by soldering the probe tips of the probe tip unit to the probe points of an IC device on a PCB). Two, the probe tip unit is typically connected to the probe amplifier unit 102 by one or more probe cables 112, 113. As discussed previously, the probe cables 112, 113 are typically substantially flexible such that a probe tip unit that is secured to an IC device is not physically disturbed by movement of the probe amplifier unit 102 or other connected components.

The implementation of the probe amplifier unit 102 to facilitate wideband active probing of IC devices also provides the capability to perform probing of an IC device while in operation. That is, a probe tip unit can be secured (e.g., by soldering) to the probe points of an IC device and the IC device can thereafter be probed while it is in operation. For example, a PCB can be placed in its usual enclosure or card-cage and probed while in operation. This is possible because of the relatively small size and light weight of the probe tip unit, since it typically does not include the probe amplifier circuitry, and because of the flexibility of the probe cables 112, 113, which in this implementation do not include multiple types of conductors (e.g., signal and power) that tend to make a cable inflexible and bulky.

The implementation of the probe amplifier unit 102 for wideband active probing also provides the capability to efficiently and inexpensively modify electrical characteristics of the wideband active probing system such as the damping resistance of the probe tips. This is because various probe units and probe tip units (e.g., the probe units 200, 300 and probe tip units 400, 500 depicted in FIGS. 1B, 1C, 1D, and 1E, respectively, and variations thereof) can be connected to the probe amplifier unit 102 to modify the electrical characteristics of the overall probing system (i.e., the probe unit or probe tip unit, probe amplifier unit, and connecting conductors). This capability to interchange probe tip units connected to the probe amplifier unit 102 also provides the convenient and efficient capability to pre-secure probe tip units to various IC devices and then connect the probe amplifier unit 102 to any one of the probe tip units while the IC device is in operation. This is convenient and efficient, for example, when several IC devices are tested with one available active probing system.

Finally, the implementation of the probe amplifier unit 102 for wideband active probing provides an inexpensive capability to perform wideband active probing on a variety of IC devices. Since the probe amplifier circuitry is contained in the probe amplifier unit 102 and not in the probe units, the probe units are less costly and, thus, various probe units can be obtained to conform to various physical and electrical probing constraints at a lower overall expense than obtaining multiple existing probe units that each include probe amplifier circuitry. Additionally, probe tip units (e.g., the probe tip units 400, 500) used with the probe amplifier unit 102 can be secured to probe points without the concern of possibly damaging more costly existing probe tip units that include probe amplifier circuitry.

It should be apparent from the foregoing discussion that the implementation of the probe amplifier unit 102 for wideband active probing provides beneficial physical and electrical features not provided by existing systems and methods. These features overcome the challenges posed by the increased complexity and compactness of IC chip package configurations and the increased performance characteristics of IC devices. Having discussed several embodiments of the probe amplifier unit 102 as well as several benefits provided by the implementation of the probe amplifier unit 102 for wideband active probing, discussion is now focused in more detail on several embodiments of probe units and probe tip units that can be implemented, for example, with the probe amplifier unit 102 for wideband active probing.

FIGS. 2A–2G show various views of embodiments of a differential probe unit 200 of the present invention. As is known, a differential probe unit typically obtains two signals that are then manipulated (for example by probe amplifier circuitry) to obtain a differential signal (i.e., the difference between the signals). The differential probe unit 200 includes a probe unit housing 202 which typically contains various components of the differential probe unit 200. The probe unit housing 202 may be constructed of various materials. For example, the probe unit housing 202 may be constructed of various types of plastic. Other materials may be used to construct the probe unit housing 202 that, preferably, do not interfere with the operation or use of the differential probe unit 200.

The differential probe unit 200 also includes probe barrels 204, 205. The probe barrels 204, 205 are typically cylindrical in shape and have an interior volume. Typically, the probe barrels 204, 205 are constructed of an electrically conductive material, for example a metal or alloy, such that they function as electrical conductors. In some embodiments, various known probe barrel designs may be implemented for the probe barrels 204, 205 within the scope of the invention.

As depicted for example in FIGS. 2A–2B, the probe barrels 204, 205 typically extend partially outside of the probe unit housing 202 such that a portion of the probe barrels 204, 205 are at least partially surrounded by and/or contained within the probe unit housing 202. The length of the portion of the probe barrels 204, 205 that extends outside of the probe unit housing 202 may vary to facilitate various probing applications. The probe barrels 204, 205 each typically extend out of the probe unit housing 202 through openings in the probe unit housing 202 as depicted, for example, in FIG. 2C. Further, the probe barrels 204, 205 may rest on portions of the internal structure (not shown) of the probe unit housing 202 in order to maintain the probe barrels 204, 205 in a substantially consistent position when the differential probe unit 200 is handled or used for probing.

Probe barrel nose cones 206, 207 (also referred to as "probe barrel end caps") extend from the ends of the probe barrels 204, 205 that extend outside the probe unit housing 202. The probe barrel nose cones 206, 207 are typically substantially conical in shape, although other shapes may be implemented, and typically have an interior volume. Typically, the probe barrel nose cones 206, 207 are constructed of an electrically non-conductive material, for example a plastic or rubber, such that they function as electrical insulators. In some embodiments, various known probe barrel nose cone designs may be implemented for the probe barrel nose cones 206, 207 within the scope of the invention.

The longitudinal axes of the probe barrel nose cones 206, 207 extend from the probe barrels 204, 205 at offset angles a1 and a2, respectively, from the longitudinal axes of the probe barrels 204, 205, as depicted for example in FIG. 2A. Typically, the offset angles a1, a2 are each at least 15° and at most 25°. However, the offset angle a1, a2 may be other independent values within the scope of the invention. The benefits of this offset angle feature of the probe barrel nose cones 206, 207 will be discussed below.

Probe tips 208, 209 extend partially out of the ends of the probe barrel nose cones 206, 207, respectively, as depicted in FIGS. 2A–2B. Thus, a portion of each probe tip 208 and 209 is at least partially surrounded by a respective probe barrel nose cone 206 and 207. The probe tips 208, 209 are typically constructed of a substantially conductive material, for example a metal or alloy, such that they function as electrical conductors. The probe tips 208, 209 are typically cylindrical in shape, although other shapes may be implemented within the scope of the invention. Further, the probe tips 208, 209 may have ends with various shapes, for example pointed, in order to facilitate making and/or maintaining physical electrical contact with probe points on a device under test. The probe tips 208, 209 may include impedance elements (not shown) to facilitate wideband active probing. In some embodiments, various known probe tip designs may be implemented for the probe tips 208, 209.

The probe tips 208, 209 extend out of the probe barrel nose cones 206, 207 substantially in line with the longitudinal axes of the probe barrel nose cones 206, 207, respectively. Thus, the longitudinal axes of the probe tips 208, 209 are offset from the longitudinal axes of the probe barrels 204, 205, respectively, at substantially the offset angles a1 and a2, which as discussed above, typically are each at least 15° and at most 25°. Further, as discussed above, the offset angles a1, a2 may be other independent values. The benefits of this offset feature of the probe tips 208, 209 will be discussed below.

Probe cables 212, 213 typically extend from within the interior of the probe unit housing 202 to outside of the probe unit housing 202. As indicated for example in FIGS. 2A–2B, the far ends of the probe cables 212, 213 typically connect to a probe amplifier (such as the probe amplifier unit 102 depicted in FIG. 1A and discussed above). Further, as depicted for example in FIG. 2A, the local ends of the probe cables 212, 213 connect to the probe barrels 204, 205, respectively. The probe cables 212, 213 may connect to the probe barrels 204, 205 in various ways within the scope of the invention, including various known ways of connecting cables to probe barrels. The connection of the probe cables 212, 213 to the probe barrels 204, 205 will be discussed further below.

The probe cables 212, 213 may include insulation or sheathing that contains one or more types of conductors. Typically, the probe cables 212, 213 are insulated coaxial conductors (e.g., coaxial cables) that are adapted to convey signals to facilitate wideband probing. In some embodiments, the probe cables 212, 213 may be substantially flexible to facilitate handling of a connected probe amplifier unit without causing substantial movement of the differential probe unit 200. The probe cables 212, 213 may include other types of conductors that serve to facilitate wideband active probing or other functions, within the scope of the invention.

One or more strain relief devices (not shown) may extend from the probe unit housing 202 and attach to the probe cables 212, 213. Such strain relief devices serve to prevent excessive strain from being placed on the connections of the probe cables 212, 213 to the probe barrels 204, 205 and/or other components of the differential probe unit 200. In some embodiments, various known types of strain relief devices may be implemented within the scope of the invention. Further, in some embodiments, one or more strain relief devices (not depicted) may be implemented alternatively at the connection of the probe cables 212, 213 to the probe barrels 204, 205.

The differential probe unit 200 may also include one or more slots 214, 215, as depicted for example in FIGS. 2A and 2C. These slots 214, 215 define openings to the interior of the probe unit housing 202 such that the probe barrels 204, 205 are at least partially exposed. The openings defined by the slots 214, 215 may have various shapes, for example a substantially rectangular shape as depicted in FIG. 2C.

One or more positioning elements 216, 217 may extend out of the slots 214, 215, respectively. The positioning elements 216, 217 are attached to the probe barrels 204, 205, respectively, such that movement of the positioning elements 216, 217 causes movement of the probe barrels 204, 205. The positioning elements 216, 217 may, for example, be implemented as levers that are attached to the probe barrels 204, 205. But, other types of components that may serve to transfer movement to the probe barrels 204, 205 through the slots 214, 215 may be implemented within the scope of the invention. Typically, the positioning elements 216, 217 are constructed of a non-conductive material such as a plastic. Additionally, other methods may be implemented within the scope of the invention to cause the movement of the probe barrels 204, 205. For example, internal gears, levers, and/or other such components in mechanical communication with external knobs, slide switches, and/or other such components (not depicted) may be implemented to cause the movement of the probe barrels 204, 205 within the scope of the invention.

One or more elastic compressible elements 220, 221 may also be included in the differential probe unit 200. For example, as depicted in FIGS. 2A–2B, elastic compressible elements 220, 221 may engage between the probe barrels 204, 205, respectively, and a portion of the probe unit housing 202. The elastic compressible elements 220, 221 may be implemented, for example, as normally decompressed or lightly compressed helical springs. In such an implementation, the elastic compressible elements 220, 221 may at least partially surround a portion of the probe cables 212, 213 within the probe unit housing 202, as depicted for example in FIGS. 2A–2B.

The differential probe unit 200 may also include a ground connector 224, as depicted for example in FIGS. 2A and 2C. The ground connector 224 is typically constructed of a conductive material, such as a metal or alloy, such that it functions as an electrical conductor. The ground connector 224 is typically connected to or in substantial contact with the probe barrels 204, 205 such that the probe barrels 204, 205 and the ground connector 224 are in electrical communication and maintain substantially the same electrical potential. The ground connector 224 may also be implemented at other locations of the differential probe unit and in other forms than that depicted in FIGS. 2A and 2C.

The combination of the probe cables 212, 213, the probe barrels 204, 205, the probe barrel nose cones 206, 207, and the probe tips 208, 209, respectively, typically serve to sense and convey signals, that are obtained for example from an IC device, to a probe amplifier and subsequently to monitoring and/or testing equipment when the differential probe unit 200 is used to perform probing. In that regard typically at least one conductor of the probe cables 212, 213 is electrically connected to the probe barrels 204, 205, respectively, for example a ground conductor. Further, typically at least one other conductor of the probe cables 212, 213 is electrically connected to the probe tips 208, 209, respectively, for example a signal conductor. These connections may be made directly to the probe tips 208, 209 or through various circuitry (not shown) internal to the probe barrels 204, 205 and/or the probe barrel nose cones 206, 207. The probe tips 208, 209 extend out of the probe barrel nose cones 206, 207, respectively, and are held in a substantially fixed position by at least the probe barrel nose cones 206, 207. Further, the probe barrel nose cones 206, 207 typically electrically isolate the probe tips 208, 209 from the probe barrels 204, 205, respectively. Thus, when the probe tips 208, 209 are brought into contact with probe points of an IC device, for example, signals are obtained by the probe tips 208, 209 that may be transmitted to a probe amplifier by one or more conductors of the probe cables 212, 213 that are electrically connected to the probe tips 208, 209, respectively.

The combined structures of the probe barrels 204, 205, probe barrel nose cones 206, 207, and probe tips 208, 209, respectively, which will be collectively referred to hereafter as "probe assemblies", may be capable of several position adjustments. The position adjustment capabilities of the probe assemblies are possible without temporarily or permanently forcing the deformation of components of the probe assemblies. For example, the probe assemblies can be adjusted to various positions without bending or stretching components of the probe assemblies to conform to the positions of probe points. Further, the probe assemblies are capable of position adjustments without degrading the overall electrical features of the differential probe unit 200, such as high bandwidth performance.

Each probe assembly is capable of retracting into the probe unit housing 202 along the longitudinal axis of the probe barrels 204, 205, respectively, as indicated in FIGS. 2A and 2D. The elastic compressible elements 220, 221, which may engage the probe barrels 204, 205, typically maintain the probe assemblies partially extended out of the probe unit housing 202. However, if pressure is applied to, for example, the probe tip 209, the respective probe assembly is able to retract partially into the probe unit housing 202, as depicted for example in FIG. 2D. Further, when the pressure on the probe tip 208 is removed, the elastic compressible element 221 may cause the respective probe assembly to re-extend out of the probe unit housing 202 to its typical partially extended position. The extent of retraction and extension of the probe assemblies may be limited, for example, by portions of the internal structure of the probe unit housing 202. This capability of the probe assemblies to reciprocate (i.e., move in/out of the probe unit housing 202) allows the probe tips 208, 209 to make effective contact with probe points that are at different heights from a common surface, for example two solder points on a PCB as depicted in FIG. 2D, when the differential probe unit 200 is utilized for probing. The probe cables 212, 213 connected to the probe assemblies are arranged within the probe unit housing 202 to facilitate the reciprocating movement of the probe assemblies. For example, if the probe cables 212, 213 are attached to a strain relief device that extends from the probe unit housing 202 (as described above), the strain relief device may allow sufficient movement of the probe cables 212, 213 in accordance with the reciprocating movement of the probe assemblies to avoid placing substantial strain on the probe cables 212, 213. As another example, a sufficient portion of the probe cables 212, 213 may be stored within the probe unit housing 202 to facilitate the reciprocating movement of the probe assemblies without placing substantial strain on the probe cables 212, 213.

Each probe assembly (i.e., probe barrel 204, 205, probe barrel nose cone 206, 207, and probe tip 208, 209, respectively) may also be capable of rotational movement about the longitudinal axis of the probe barrels 204, 205, respectively, as indicated for example in FIGS. 2E–2G. As described above, the internal structure of the probe unit housing 202 is adapted to maintain the probe barrels 204, 205, and thus the probe assemblies, in a substantially consistent position when the differential probe unit 200 is handled or used for probing. In this regard, the internal structure of the probe unit housing 202 is adapted to maintain the probe assemblies in at least a substantially consistent rotational position with respect to the longitudinal axes of the probe barrels 204, 205. Each probe assembly can be rotated about the longitudinal axis of its respective probe barrel 204, 205 by, for example, applying rotational force to the assembly. Once the probe assembly is rotated to a particular position, the internal structure of the probe unit housing 202 causes it to maintain that rotational position during handling or probing with the differential probe unit 200 due to, for example, the frictional engagement of the probe barrels 204, 205 and the internal structure of the probe unit housing 202. The probe cables 212, 213 connected to the probe assemblies are arranged within the probe unit housing 202 to facilitate the rotational movement of the probe assemblies. For example, if the probe cables 212, 213 are attached to a strain relief device that extends from the probe unit housing 202 (as described above), the strain relief device may allow sufficient movement of the probe cables 212, 213 in accordance with the rotational movement of the probe assemblies to avoid placing substantial strain on the probe cables 212, 213. As another example, a sufficient portion of the probe cables 212, 213 may be stored within the probe unit housing 202 to facilitate the rotational movement of the probe assemblies without placing substantial strain on the probe cables 212, 213.

As described above, the differential probe unit 200 may include slots 214, 215 through which positioning elements 216, 217 extend, and positioning elements 216, 217 may be attached to the probe barrels 204, 205, respectively. In this regard, the positioning elements 216, 217 may be an integral part of the probe assemblies. Thus, when force is applied to one of the positioning elements 216, 217, it causes the respective probe assembly to rotate accordingly. As depicted for example in FIGS. 2E and 2G, the rotational movement of each probe assembly may be limited when the positioning elements 216, 217 engage the sides of the slots 214, 215, respectively. For example, with respect to FIG. 2E, if the positioning element 217 is moved substantially upward, the respective probe assembly will be rotated until the positioning element 217 engages the top edge of the slot 215. Thus, when the differential probe unit 200 is used for probing, each probe assembly can be independently rotated to a desired position by moving the positioning elements 216, 217. Furthermore, the probe assemblies will remain in the desired position (as described above) when the positioning elements 216, 217 are no longer moved.

The rotational capability of the probe assemblies and the offset axis configuration of the probe barrel nose cones 206, 207 and probe tips 208, 209 from the probe barrels 204, 205 respectively, as described above, provides the benefit of a variable spacing capability between the probe tips 208, 209. This variable spacing capability of the probe tips 208, 209 facilitates probing of various configurations of probe points, for example of an IC device mounted on a PCB, without bending or stretching components of the probe assemblies or forcing the components to conform to probe point spacing by temporarily deforming them. Further, the variable spacing capability of the probe tips 208, 209 does not degrade the overall electrical features of the differential probe unit 200, such as high bandwidth performance.

FIGS. 2E–2G show exemplary depictions of the variable spacing capability of the probe tips 208, 209. As depicted in FIG. 2E, when the positioning elements 216, 217 are moved substantially upward until they engage the top edge of the slots 214, 215, the probe assemblies may be rotated such that the probe tips 208, 209 are positioned at a minimal spacing D1. This spacing D1 of the probe tips occurs because the probe assemblies are rotated such that the probe tips 208, 209 are tilted inward due to their offset longitudinal axes from the longitudinal axes of the probe barrels 204, 205, respectively, as discussed above. Similarly, FIG. 2F depicts the positioning levers 216, 217 moved to a position approximately midway between the top and bottom edges of the slots 214, 215, and accordingly, the probe assemblies may be rotated such that the probe tips 208, 209 are positioned at a spacing D2 which is greater than spacing D1. Finally, in FIG. 2G, the positioning elements are moved substantially downward to engage the bottom edge of the slots 214, 215 causing the probe assemblies to rotate such that the probe tips 208, 209 may be positioned at a maximal spacing D3 which is greater than spacing D2. At this position, the probe tips 208, 209 are tilted outward due to their offset longitudinal axes from the longitudinal axes of the probe barrels 204, 205, respectively, as discussed above.

It is noted for clarity that the foregoing descriptions with respect to FIGS. 2E–2G are exemplary of the variable spacing capabilities of the probe tips 208, 209, but are not exclusive. For example, depending on the embodiment of the differential probe unit 200, the positioning and spacing of the probe tips 208, 209 with respect to the positions of the positioning elements 216, 217 may vary from what is depicted in FIGS. 2E–2G and described in the foregoing.

Discussion is now focused on another group of probe unit embodiments of the present invention. FIGS. 3A–3G depict various views of embodiments of a single-end probe unit 300 of the present invention. As is known, a single-end probe unit, in contrast to a differential probe unit, typically obtains a signal with respect to ground, such as a voltage signal from an IC device. The single-end probe unit 300 includes a probe unit housing 302 which typically contains various components. The probe unit housing 302 is typically substantially cylindrical and has an interior volume. Further, the probe unit housing 302 is typically constructed of an electrically non-conductive material, for example a plastic or rubber, such that it functions as an electrical insulator. In some embodiments, various known probe housing designs may be implemented for the probe unit housing 302 within the scope of the invention.

The single-end probe unit 300 further includes a probe barrel 304. The probe barrel 304 is typically cylindrical in shape and has an interior volume. Typically, the probe barrel 304 is constructed of an electrically conductive material, for example a metal or alloy, such that it functions as an electrical conductor. In some embodiments, various known probe barrel designs may be implemented for the probe barrel 304.

As depicted in FIGS. 3A–3B, the probe barrel 304 typically extends partially outside of the probe unit housing 302 such that a portion of the probe barrel 304 is at least partially surrounded by and/or contained within the probe unit housing 302. The length of the portion of the probe barrel 304 that extends outside of the probe unit housing 302 may vary to facilitate various probing applications. The probe barrel 304 typically extends out of the probe unit housing 302 through an opening in the probe unit housing 302 as depicted in FIG. 3C. Further, the probe barrel 304 may rest on portions of the internal structure (not shown) of the probe unit housing 302 in order to maintain the probe barrel 304 in a substantially consistent position when the single-end probe unit 300 is handled or used for probing.

A probe barrel nose cone 306 (also referred to as a "probe barrel end cap") extends from the end of the probe barrel 304 that extends outside the probe unit housing 302. The probe barrel nose cone 306 is typically substantially conical in shape, although other shapes may be implemented, and typically has an interior volume. Typically, the probe barrel nose cone 306 is constructed of an electrically non-conductive material, for example a plastic or rubber, such that it functions as an electrical insulator. In some embodiments, various known probe barrel nose cone designs may be implemented for the probe barrel nose cone 306.

The longitudinal axis of the probe barrel nose cone 306 extends from the probe barrel 304 at an offset angle a3 from the longitudinal axis of the probe barrel 304, as depicted for example in FIG. 3A. Typically, the offset angle a3 is at least 15° and at most 25°. However, the offset angle a3 may be other values within the scope of the invention. The benefits of this offset feature will be discussed below.

A probe tip 308 extends partially out of the end of the probe barrel nose cone 306 as depicted in FIGS. 3A–3B. Thus, a portion of the probe tip 308 is at least partially surrounded by the probe barrel nose cone 306. The probe tip 308 is typically cylindrically shaped, although other shapes may be implemented within the scope of the invention. The probe tip 308 is typically constructed of a substantially conductive material, for example a metal or alloy, such that it functions as an electrical conductor. The probe tip 308 may include one or more resistive elements (not shown) to facilitate wideband active probing. Further, the end of the probe tip 308 may have various shapes, for example pointed, to facilitate making and/or maintaining contact with a probe point. In some embodiments, various known probe tip designs may be implemented for the probe tip 308.

The probe tip 308 extends out of the probe barrel nose cone 306 substantially in line with the longitudinal axes of the probe barrel nose cone 306. Thus, the longitudinal axis of the probe tip 308 is offset from the longitudinal axis of the probe barrel 304 at substantially the offset angle a3, which as discussed above, typically is at least 15° and at most 25°. Further, as discussed above, the offset angle a3 may be other values. The benefits of this offset feature of the probe tip 308 will be discussed below.

The single-end probe unit 300 also includes a ground tip unit 314 that is attached to the probe barrel 304. The ground tip unit 314 has a ground tip connector 315 which is typically substantially annular shaped. The ground tip connector 315 at least partially surrounds a portion of the probe barrel 304 that extends from the probe unit housing 302. The ground tip connector 315 is adapted to maintain the ground tip unit 314 in a substantially consistent position when the single-end probe unit 300 is handled or used for probing.

A ground tip receptacle 316 is connected to the ground tip connector 315. The ground tip receptacle 316 is typically cylindrical in shape and has an interior volume. A ground tip 317 extends from inside of the ground tip receptacle 316. The ground tip 317 is typically cylindrical in shape, although other shapes may be implemented. The end of the ground tip 317 may have various shapes, for example pointed, to facilitate making and/or maintaining contact with a probe point. The ground tip 317 extends partially outside of the interior of the ground tip receptacle 316 such that a portion of the ground tip 317 is at least partially surrounded by and/or contained within the ground tip receptacle 316. The end of the ground tip 317 that is partially surrounded by and/or contained within the ground tip receptacle 316 and the internal structure of the ground tip receptacle 316 are typically adapted such that the ground tip 317 is retained at least partially within the ground tip receptacle 316. For example, as depicted in FIG. 3B, the end of the ground tip 317 may be flared to a diameter that is wider than the opening in the ground tip receptacle 316 through which the ground tip 317 extends such that the flared end engages the internal structure of the ground tip receptacle 316.

As depicted in FIG. 3B, the ground tip unit 314 may also include an elastic compressible element 320 disposed within the ground tip receptacle 316. The elastic compressible element 320 typically engages the end of the ground tip 317 and a portion of the internal structure of the ground tip receptacle 316. The elastic compressible element 320 may be implemented, for example, as a normally decompressed or lightly compressed helical spring.

The components of the ground tip unit 314, i.e. the ground tip connector 315, the ground tip receptacle 316, the ground tip 317, and the elastic compressible element 320, are typically constructed of a substantially conductive material, for example a metal or alloy, such that they function as electrical conductors. Further, these components of the ground tip unit 314 are typically in electrical communication.

The longitudinal axes of the ground tip receptacle 316 and the ground tip 317 are typically substantially in-line. Further, the ground tip unit 314 is typically attached to the probe barrel 304 such that the longitudinal axes of the ground tip receptacle 316 and the ground tip 317 are typically substantially parallel to the longitudinal axis of the probe barrel 304.

A probe cable 312 typically extends from within the interior of the probe unit housing 302 to outside of the probe unit housing 302. As indicated for example in FIGS. 3A–3B, the far end of the probe cable 312 typically connects to a probe amplifier (such as the probe amplifier unit 102 depicted in FIG. 1A and discussed above). Further, as depicted for example in FIG. 3A, the local end of the probe cable 312 connects to the probe barrel 304. The probe cable 312 may connect to the probe barrel 304 in various ways within the scope of the invention, including various known ways of connecting a cable to a probe barrel. The connection of the probe cable 312 to the probe barrel 304 will be discussed further below.

The probe cable 312 may include insulation or sheathing that contains one or more types of conductors. Typically, the probe cable 312 is an insulated coaxial conductor (e.g., a coaxial cable) that is adapted to convey signals to facilitate wideband probing. In some embodiments, the probe cable 312 may be substantially flexible to facilitate handling of a connected probe amplifier unit without causing substantial movement of the single-end probe unit 300. The probe cable 312 may include other types of conductors that serve to facilitate wideband active probing or other functions, within the scope of the invention.

A strain relief device 318 may extend from the probe unit housing 302 and attach to the probe cable 312, as depicted for example in FIGS. 3A–3B. The strain relief device 318 serves to prevent excessive strain from being placed on the connection of the probe cable 312 to the probe barrel 304 and/or other components of the single-end probe unit 300. In some embodiments, various known types of strain relief devices may be implemented. Further, in some embodiments, a strain relief device (not depicted) may be implemented alternatively at the connection of the probe cable 312 to the probe barrel 304.

The combination of the probe cable 312, the probe barrel 304, the probe barrel nose cone 306, the probe tip 308, and the ground tip unit 314 typically serve to convey signals, that are obtained for example from an IC device, to a probe amplifier and subsequently to monitoring and/or testing equipment when the single-end probe unit 300 is utilized to perform probing. In that regard, typically at least one conductor of the probe cable 312 is electrically connected to the probe barrel 304, for example a ground conductor. The ground tip unit 314 is typically connected in electrical communication with the probe barrel 304 by the ground tip connector 315 such that the ground tip 317 is in electrical communication with the probe barrel 304.

Typically, at least one other conductor of the probe cable 312 is electrically connected to the probe tip 308, for example a signal conductor. This connection may be made directly to the probe tip 308 or through various circuitry (not shown) internal to the probe barrel 304 and/or the probe barrel nose cone 306. The probe tip 308 extends out of the probe barrel nose cone 306 and is held in a substantially fixed position by at least the probe barrel nose cone 306. Further, the probe barrel nose cone 306 typically electrically isolates the probe tip 308 from the probe barrel 304. Thus, when the probe tip 308 and ground tip 317 are brought into contact with probe points of an IC device, for example, signals are obtained by the probe tip 308 which may be transmitted to a probe amplifier by one or more conductors of the probe cable 312 that are electrically connected to the probe tip 308.

The ground tip unit 314 may be capable of several position adjustments. The position adjustment capabilities of the ground tip unit 314, which are described hereafter, are possible without temporarily or permanently forcing the deformation of components of the ground tip unit 314. For example, the ground tip unit 314 can be adjusted to various positions without bending or stretching the components of the ground tip unit 314 to, for example, conform to the positions of probe points. Further, the ground tip unit 314 is capable of position adjustments without degrading the overall electrical features of the single-end probe unit 300, such as high bandwidth performance.

The ground tip 317 may be capable of retracting into the ground tip receptacle 316, as indicated for example in FIGS. 3A, 3B and 3D. The elastic compressible element 320, which may engage the ground tip 317, typically maintains the ground tip 317 partially extended out of the ground tip receptacle 316. However, if pressure is applied to the ground tip 317, for example by contact with a probe point, the ground tip 317 is able to retract partially into the ground tip receptacle 316, as depicted for example in FIG. 3D. Further, when the pressure on the ground tip 317 is removed, the elastic compressible element 320, which typically engages the ground tip 317 and a portion of the internal structure of the ground tip receptacle 316, causes the ground tip 317 to re-extend out of the ground tip receptacle 316 to its typical partially extended position. The extent of retraction and extension of the ground tip 317 may be limited by, for example, portions of the internal structure of the ground tip receptacle 316, as discussed above. The capability of the ground tip 317 to reciprocate (i.e., move in/out of the ground tip receptacle 316) allows the probe tip 308 and ground tip 317 to make effective contact with probe points (e.g., a signal probe point and a ground probe point) that are at different heights from a common surface. For example, the probe tip 308 and ground tip 317 are able to make effective contact with two solder points at different heights on a PCB, as depicted for example in FIG. 3D, when the single-end probe unit 300 is utilized for probing. The probe tip 317 and the probe tip receptacle 316 are adapted such that the ground tip 317 maintains electrical communication with the probe barrel 304 during the reciprocating movement of the probe tip 317 in and out of the probe tip receptacle 316. The elastic compressible element 320 may also serve to maintain the ground tip 317 in electrical communication with the probe barrel 304 in cooperation with the probe tip 317 and the probe tip receptacle 316.

The ground unit 314 may also be capable of rotational movement about the longitudinal axis of the probe barrel 304, as indicated for example in FIGS. 3E–3G. As described above, the ground tip connector 315 is adapted to maintain the ground tip unit 314 in a substantially consistent position when the single-end probe unit 300 is handled or used for probing. In this regard, the ground tip connector 315 is adapted to maintain the ground tip unit 314 in a substantially consistent rotational position with respect to the longitudinal axis of the probe barrel 304. The ground tip unit 314 can be rotated about the longitudinal axis of the probe barrel 304 by, for example, applying a rotational force to it. Once the ground tip unit 314 is rotated to a particular position, the ground tip connector 315 causes the ground tip unit 314 to maintain that rotational position during handling or probing with the single-end probe unit 300 due to, for example, the frictional engagement of the ground tip connector 315 and the probe barrel 304. The ground tip connector 315 is adapted such that the ground tip 317 maintains electrical communication with the probe barrel 304 during the rotational movement of the probe tip unit 314 about the longitudinal axis of the probe barrel 304.

The rotational capability of the ground tip unit 314 and the offset axis configuration of the probe barrel nose cone 306 and probe tip 308 from the probe barrel 304, as described above, provides the benefit of a variable spacing capability between the probe tip 308 and the ground tip 317. This variable spacing capability between the probe tip 308 and the ground tip 317 facilitates probing of various configurations of probe points, for example of an IC device mounted on a PCB, without bending or stretching components of the single-end probe unit 300 or forcing the components to conform to probe point spacing by temporarily deforming them. Further, the variable spacing capability between the probe tip 308 and the ground tip 317 does not degrade the overall electrical features of the single-end probe unit 300, such as high bandwidth performance.

FIGS. 3E–3G show exemplary depictions of the variable spacing capability between the probe tip 308 and the ground tip 317. As depicted in FIG. 3E, when the ground tip unit 314 is rotated to a first position about the longitudinal axis of the probe barrel 304, the probe tip 308 and the ground tip 317 are positioned at a minimal spacing S1. This spacing S1 between the probe tip 308 and the ground tip 317 occurs because the ground tip unit 314 is rotated such that the probe tip 308 is tilted toward the ground tip 317 due to the offset longitudinal axis of the probe tip 308 from the longitudinal axis of the probe barrel 304, as discussed above. Similarly, FIG. 3F depicts the ground tip unit 314 rotated to a second position about the longitudinal axis of the probe barrel 304 such that the probe tip 308 and the ground tip 317 are positioned at a spacing S2, which is greater than spacing S1. Finally, in FIG. 3G, the ground tip unit 314 is rotated to a third position about the longitudinal axis of the probe barrel 304 such that the probe tip 308 and the ground tip 317 are positioned at a maximal spacing S3, which is greater than spacing S2. At this position, the ground tip unit 314 is rotated such that the probe tip 308 is tilted away from the ground tip 317 due to the offset longitudinal axis of the probe tip 308 from the longitudinal axis of the probe barrel 304, as discussed above.

Having discussed several embodiments of probe units above, discussion is now focused on several embodiments of probe tip units of the present invention. In that regard, FIG. 4 depicts a differential probe tip unit 400 of the present invention. As is known, a differential probe tip unit typically obtains two signals, from an IC device for example, that are then manipulated (for example by probe amplifier circuitry) to obtain a differential signal (i.e., the difference between the signals).

The differential probe tip unit 400 includes a probe unit housing 402 which may contain various probe tip unit circuitry (not shown) ranging from conductor traces to various resistive, capacitive, and/or other electronic elements. The probe unit housing 402 may be constructed of various materials, such as various types of plastic. Other materials may be used to construct the probe unit housing 402, preferably that do not interfere with the operation or use of the differential probe tip unit 400, within the scope of the invention.

The differential probe tip unit 400 includes probe tip units 406, 407 which are connected to the probe tip unit circuitry at the probe connection points 404, 405, respectively. The probe tip units 406, 407 include probe tips 408, 409, respectively. The probe tip units 406, 407 may also include probe impedance elements 410, 411, respectively, to facilitate wideband active probing using the differential probe tip unit 400. The probe connection points 404, 405 may be implemented by various types of electrical connections, for example solder connections or compression terminal connections, which are all within the scope of the invention.

The components of the probe tip units 406, 407 are typically substantially electrically conductive such that the probe tips 408, 409 are in electrical communication with the probe connection points 404, 405, respectively. For example, the probe tips 408, 409 are typically constructed of electrically conductive material, such as a metal or alloy. The probe tips 408, 409 may have various shapes, for example cylindrical, to facilitate their connections to probe points of, for example, an IC device.

Probe cables 412, 413 typically extend from within the interior of the probe unit housing 402 to outside of the probe unit housing 402. As indicated for example in FIG. 4, the far ends of the probe cables 412, 413 typically connect to a probe amplifier (such as the probe amplifier unit 102 depicted in FIG. 1A and discussed above). The local ends of the probe cables 412, 413 typically connect to the probe tip unit circuitry (not shown) within the probe unit housing 402. The probe cables 412, 413 may connect to the probe tip unit circuitry in various ways within the scope of the invention, for example by solder connections or compression terminal connections.

The probe cables 412, 413 may include cable insulation or sheathing that contains one or more types of conductors. Typically, the probe cables 412, 413 are insulated coaxial conductors (i.e., coaxial cables) that are adapted to convey signals to facilitate wideband probing. The probe cables 412, 413 are typically substantially flexible to facilitate handling of a connected probe amplifier unit without causing substantial movement of the differential probe tip unit 400. The probe cables 412, 413 may include other types of conductors that serve to facilitate wideband active probing or other functions, within the scope of the invention.

One or more strain relief devices 418 may extend from the probe unit housing 402 and attach to the probe cables 412, 413. Such strain relief devices 418 serve to prevent excessive strain from being placed on the connections of the probe cables 412, 413 to the probe tip unit circuitry and/or other components of the differential probe tip unit 400. In some embodiments, various known types of strain relief devices may be implemented within the scope of the present invention.

The combination of the probe cables 412, 413 and the probe tip units 406, 407, respectively, typically serve to convey signals, that are obtained for example from an IC device, to a probe amplifier and subsequently to monitoring and/or testing equipment when the differential probe tip unit 400 is utilized to perform probing. In that regard, typically at least one conductor of the probe cables 412, 413 is electrically connected to the probe tip units 406, 407, respectively, for example a signal conductor. These connections may be made directly to the probe tip units 406, 407 or through various probe tip unit circuitry (not shown) internal to the probe unit housing 402. Further, typically at least one other conductor of the probe cables 412, 413 is electrically connected to the ground circuitry of the probe tip unit circuitry (not shown), for example a ground conductor. In this regard, when the probe tips 408, 409 are brought into contact with probe points of an IC device, signals are obtained by the probe tip units 406, 407 which may be transmitted to a probe amplifier by one or more conductors of the probe cables 412, 413 that are electrically connected to the probe tip units 406, 407, respectively.

The differential probe tip unit 400 is typically adapted to facilitate hands-free and in-operation probing. In that regard, the differential probe tip unit 400 is typically adapted to be small-sized and lightweight such that the probe tip units 406, 407 can be securely connected to probe points of, for example, an IC device that is mounted on a PCB. The flexibility of the probe cables 412, 413, as discussed above, also facilitates such hands-free probing by minimizing physical disturbance of the differential probe tip unit 400 when connected equipment, such as a probe amplifier, are handled or repositioned. Typically, the probe tip units 406, 407 are secured by soldering the probe tips 408, 409 to the probe points, although other types of connections may be implemented within the scope of the invention. Preferably, connections are made in a manner, such as by soldering, to minimize the parasitic input impedance to the probe tip units 406, 407 at the connections to the probe points.

The small size and light weight of the differential probe tip unit 400, as well as the flexibility of the probe cables 412, 413, also facilitates in-operation probing. Thus, the probe tip units 406, 407 can be secured to probe points on a PCB which is placed in normal operation by inserting it into an enclosure or card-cage. This capability facilitates more effective monitoring and/or testing to, for example, troubleshoot a problem component or PCB circuitry. Further, this capability facilitates connecting several differential probe units 400 to various probe points so that efficient in-operation probing can be conducted using a single probe amplifier that is connected to each of the differential probe units 400 as needed.

Electrical characteristics of a wideband active probing system, such as the damping resistance of the probe tips, can be efficiently and inexpensively modified by utilizing various embodiments of the differential probe tip unit 400 that have different electrical characteristics. The electrical characteristics of the differential probe tip unit 400 may be varied by, for example, modifying the internal probe tip unit circuitry and/or the probe tips. In that regard, various configurations of probe tip units 406, 407 may be implemented with the differential probe tip unit 400.

FIG. 6 shows several configurations of probe tip units, among others, that may be implemented with the differential probe tip unit 400. Solder-on probe tip units 601 and plug-on probe tip units 602 are two exemplary configurations of probe tip units shown. There are also SMT (surface-mount technology) grabber probe tip units 603 and wedge probe tip units 604. Many other configurations of probe tip units can be implemented with the differential probe tip unit 400 within the scope of the invention.

Since the probe tip units 406, 407 are connected to the differential probe tip unit 400 at the connection points 404, 405, the probe tip units 406, 407 can be replaced efficiently and inexpensively if, for example, there is a need to modify the electrical characteristics of the probing system or an existing probe tip unit is damaged. In that regard, the probe tip units 406, 407 can be replaced with other probe tip units, such those depicted in FIG. 6 by, for example, de-soldering the existing probe tip units 406, 407 from the connection points 404, 405 and soldering replacement probe tip units to the connection points 404, 405. Alternatively, several differential probe tip units 400 can be configured with various probe tip units 406, 407 to be implemented as needed for probing.

FIG. 5 depicts a single-end probe tip unit 500 of the present invention. As is known, a single-end probe tip unit, in contrast to a differential probe tip unit, typically obtains a signal with respect to ground, such as a voltage from an IC device. The single-end probe tip unit 500 includes a probe unit housing 502 which may contain various probe tip unit circuitry (not shown) ranging from conductor traces to various resistive, capacitive, and/or other electronic elements. The probe unit housing 502 may be constructed of various materials, such as various types of plastic. Other materials may be used to construct the probe unit housing 502, preferably that do not interfere with the operation or use of the single-end probe tip unit 500, within the scope of the invention.

The single-end probe tip unit 500 includes probe tip units 506, 507 which are connected to the probe tip unit circuitry at the probe connection points 504, 505, respectively. The probe tip units 506, 507 include probe tips 508, 509, respectively. The probe tip units 506, 507 may also include probe impedance elements 510, 511, respectively, to facilitate wideband active probing using the single-end probe tip unit 500. The probe connection points 504, 505 may be implemented by various types of electrical connections, for example solder connections or compression terminal connections, and are all within the scope of the invention.

The components of the probe tip units 506, 507 are typically substantially electrically conductive such that the probe tips 508, 509 are in electrical communication with the probe connection points 504, 505, respectively. For example, the probe tips 508, 509 are typically constructed of electrically conductive material, such as a metal or alloy. The probe tips 508, 509 may have various shapes, for example cylindrical, to facilitate connections to probe points of, for example, an IC device.

A probe cable 512 typically extends from within the interior of the probe unit housing 502 to outside of the probe unit housing 502. As indicated for example in FIG. 5, the far end of the probe cable 512 typically connects to a probe amplifier (such as the probe amplifier unit 102 depicted in FIG. 1A and discussed above). The local end of the probe cable 512 typically connects to the probe tip unit circuitry (not shown) within the probe unit housing 502. The probe cable 512 may connect to the probe tip unit circuitry in various ways within the scope of the invention, for example by solder connections or compression terminal connections.

The probe cable 512 may include cable insulation or sheathing that contains one or more types of conductors. Typically, the probe cable 512 is an insulated coaxial conductor (e.g., a coaxial cable) that is adapted to convey signals to facilitate wideband probing. The probe cable 512 is typically substantially flexible to facilitate handling of a connected probe amplifier unit without causing substantial movement of the single-end probe tip unit 500. The probe cable 512 may include other types of conductors that serve to facilitate wideband active probing or other functions, within the scope of the invention.

A strain relief device 518 may extend from the probe unit housing 502 and attach to the probe cable 512. Such a strain relief device 518 serves to prevent excessive strain from being placed on the connections of the probe cable 512 to the probe tip unit circuitry and/or other components of the single-end probe tip unit 500. In some embodiments, various known types of strain relief devices may be implemented within the scope of the present invention.

The combination of the probe cable 512 and the probe tip units 506, 507 typically serve to convey signals, that are obtained for example from an IC device, to a probe amplifier and subsequently to monitoring and/or testing equipment when the single-end probe tip unit 500 is utilized to perform probing. In that regard, typically at least one conductor of the probe cable 512 is electrically connected to the probe tip unit 506, for example a signal conductor. Further, typically at least one other conductor of the probe cable 512 is electrically connected to the probe tip unit 507, for example a ground conductor. These connections may be made directly to the probe tip units 506, 507 or through various probe tip unit circuitry (not shown) internal to the probe unit housing 502. In this regard, when the probe tips 508, 509 are brought into contact with probe points of an IC device, for example, signals are obtained by the probe tip units 506, 507 which may be transmitted to a probe amplifier by one or more conductors of the probe cable 512 that are electrically connected to the probe tip units 506, 507, respectively.

The single-end probe tip unit 500 is typically adapted to facilitate hands-free and in-operation probing. In that regard, the single-end probe tip unit 500 is typically adapted to be small-sized and lightweight such that the probe tip units 506, 507 can be securely connected to probe points of, for example, an IC device that is mounted on a PCB. The flexibility of the probe cable 512, as discussed above, also facilitates such hands-free probing by minimizing physical disturbance of the single-end probe tip unit 500 when connected equipment, such as a probe amplifier, are handled or repositioned. Typically, the probe tip units 506, 507 are secured by soldering the probe tips 508, 509 to the probe points, although other types of connections may be implemented within the scope of the invention. Preferably, connections are made in a manner, such as by soldering, to minimize the parasitic input impedance to the probe tip units 506, 507 at the connections to the probe points.

The small size and light weight of the single-end probe tip unit 500, as well as the flexibility of the probe cable 512, also facilitates in-operation probing. Thus, the probe tip units 506, 507 can be secured to probe points on a PCB which is placed in normal operation by inserting it into an enclosure or card-cage. This capability facilitates more effective monitoring and/or testing to, for example, troubleshoot a problem component or PCB circuitry. Further, this capability facilitates connecting several single-end probe units 500 to various probe points so that efficient in-operation probing can be conducted using a single probe amplifier that is connected to each of the single-end probe units 500 as needed.

Electrical characteristics of a wideband active probing system, such as the damping resistance of the probe tips, can be efficiently and inexpensively modified by utilizing various embodiments of the single-end probe tip unit 500 that have different electrical characteristics. The electrical characteristics of the single-end probe tip unit 500 may be varied, for example, by modifying the internal probe tip unit circuitry and/or the probe tips. In that regard, various configurations of probe tip units 506, 507 may be implemented with the single-end probe tip unit 500. For example, FIG. 6 shows several configurations of probe tip units, among others, that may be implemented. There are solder-on probe tip units 601 and plug-on probe tip units 602. There are also SMT (surface-mount technology) grabber probe tip units 603 and wedge probe tip units 604. Many other configurations of probe tip units can be implemented on the single-end probe tip unit 500 within the scope of the invention.

Since the probe tip units 506, 507 are connected to the single-end probe tip unit 500 at the connection points 504, 505, the probe tip units 506, 507 can be replaced efficiently and inexpensively if, for example, there is a need to modify the electrical characteristics of the probing system or an existing probe tip unit is damaged. In that regard, the probe tip units 506, 507 can be replaced with other probe tip units, such those depicted in FIG. 6, by, for example, de-soldering the existing probe tip units 506, 507 from the connection points 504, 505 and soldering replacement probe tip units to the connection points 504, 505. Alternatively, several single-end probe units 500 can be configured with various probe tip units 506, 507 to be implemented as needed for probing.

It should be understood that throughout the foregoing discussion of the present invention, references made to the probing of IC devices are merely exemplary, and the probing of other electrical circuits and/or electronic devices applies to such references within the scope of the invention.

It should be further understood that the above-described embodiments of the present invention are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A system for wideband active probing of devices and circuits in operation, comprising:
   a probe amplifier unit that comprises probe amplifier circuitry;
   a first plurality of conductors electrically connected to said probe amplifier circuitry that comprises at least one power supply conductor and at least one signal transmission conductor;
   a signal monitoring apparatus configured to monitor electrical signals and in electrical communication with said probe amplifier circuitry through said first plurality of conductors;
   a second plurality of conductors electrically connected to said probe amplifier circuitry that comprises at least one signal transmission conductor; and
   a probing apparatus configured to probe electrical circuits and in electrical communication with said probe amplifier circuitry through said second plurality of conductors, said probing apparatus comprising a probe housing and first and second probe tips in electrical communication with said second plurality of conductors, wherein the spacing between the first and second probe tips is adjustable.

2. The system of claim 1, wherein said probing apparatus is a single-end probe or a differential probe.

3. The system of claim 1, wherein said first and second probe tips are configured to be attached to a probe point.

4. The system of claim 1, wherein said first and second probe tips are detachable from said probing apparatus and said probing apparatus is configured for the attachment of substitute probe tips in place of said first and second probe tips.

5. The system of claim 1, wherein said signal monitoring apparatus is an oscilloscope or a logic analyzer.

6. The system of claim 1, wherein:
   said first plurality of conductors comprises a power supply cable having at least two power supply conductors, and a coaxial cable having at least two signal transmission conductors; and
   said second plurality of conductors comprises a coaxial cable having at least two signal transmission conductors.

7. The system of claim 1, wherein said second plurality of conductors is configured to be more flexible than said first plurality of conductors.

8. The system of claim 1, wherein:
   said first plurality of conductors is attached to said probe amplifier unit by at least a first strain relief; and
   said second plurality of conductors is attached to said probe amplifier unit by at least a second strain relief.

9. The system of claim 1, wherein the probing apparatus further comprises first and second nose cones for supporting the first and second probe tips, respectively.

10. The system of claim 9, wherein the nose cones are rotatable about a longitudinal axis.

11. The system of claim 10, wherein the probe tips are oriented at an offset angle with respect to the longitudinal axis, whereby rotation of the nose cones causes the spacing between the probe tips to change.

12. The system of claim 10, wherein the probing apparatus further comprises first and second positioning elements for enabling rotation of the first and second nose cones, respectively.

13. The system of claim 1, wherein the probing apparatus further comprises a nose cone for supporting the first probe tip and a ground tip connector for supporting the second probe tip, the ground tip connected to a ground conductor.

14. The system of claim 13, wherein the ground tip connector is rotatable about a longitudinal axis of the nose cone.

15. The system of claim 14, wherein the first probe tip is oriented on the nose cone at an offset angle, whereby rotation of the ground tip connector causes the spacing between the first and second probe tips to change.

16. A method for wideband active probing of devices and circuits in operation, comprising the steps of:
   providing a probe amplifier unit that comprises probe amplifier circuitry;
   electrically connecting a first plurality of conductors to said probe amplifier circuitry;
   electrically connecting a signal monitoring apparatus to said first plurality of conductors to place said signal monitoring apparatus in electrical communication with said probe amplifier circuitry;
   electrically connecting a second plurality of conductors to said probe amplifier circuitry;
   providing a probing apparatus having a probe housing and first and second probe tips;
   electrically connecting the probing apparatus to said second plurality of conductors to place said first and second probe tips of said probing apparatus in electrical communication with said probe amplifier circuitry;
   adjusting the spacing between the first and second probe tips;
   probing an electrical circuit with said probing apparatus; and
   monitoring signals with said signal monitoring apparatus that are obtained during said step of probing.

17. The method of claim 16, wherein said step of probing comprises attaching said probing apparatus to at least one probe point of an electrical circuit so that electrical signals are obtained from the probe point by said probing apparatus.

18. The method of claim 16, wherein said first and second probe tips are detachable from said probing apparatus and said probing apparatus is configured for the attachment of substitute probe tips in place of said first and second probe tips, and further comprising the steps of:
   detaching said first and second probe tips from said probing apparatus; and
   attaching substitute probe tips to said probing apparatus.

19. An apparatus for monitoring electrical signals, the apparatus comprising:
- a probing unit comprising a probe housing and a pair of probe tips, the probe tips configured to contact an electrical circuit and receive electrical signals from the electrical circuit, wherein the spacing between the pair of probe tips is adjustable;
- a first pair of electrical conductors leading from the probe housing, the first pair of electrical conductors being electrically coupled to the pair of probe tips;
- an amplifying unit comprising an amplifier housing and an amplifier circuit within the amplifier housing, the amplifier circuit being electrically coupled to the first pair of electrical conductors;
- a second pair of electrical conductors leading from the amplifier housing, the second pair of electrical conductors being electrically coupled to the amplifier circuit; and
- a signal monitoring unit electrically coupled to the second pair of electrical conductors, the signal monitoring unit configured to monitor said electrical signals from the electrical circuit.

20. The apparatus of claim 19, wherein the probing unit further comprises at least one non-conductive nose cone for supporting at least one of the pair of probe tips, the at least one nose cone defined by a longitudinal axis.

21. The apparatus of claim 20, wherein the at least one nose cone orients the at least one of the pair of probe tips at an offset angle with respect to the longitudinal axis.

22. The apparatus of claim 21, wherein the at least one nose cone is configured to be rotated about the longitudinal axis, whereby rotation of the at least one nose cone about the longitudinal axis causes the spacing between the probe tips to change.

23. The apparatus of claim 22, wherein the probing unit further comprises at least one positioning element for enabling rotation of the at least one nose cone.

24. The apparatus of claim 21, wherein the probing unit further comprises a grounding tip connector for supporting one of the pair of probe tips, the grounding tip connector being configured to rotate about the longitudinal axis, whereby rotation of the grounding tip connector causes the spacing between the pair of probe tips to change.

* * * * *